(12) United States Patent
Kim et al.

(10) Patent No.: US 11,200,297 B2
(45) Date of Patent: Dec. 14, 2021

(54) INTEGRATOR VOLTAGE SHIFTING FOR IMPROVED PERFORMANCE IN SOFTMAX OPERATION

(71) Applicant: INTERNATIONAL BUSINESS MACHINES CORPORATION, Armonk, NY (US)

(72) Inventors: Seyoung Kim, White Plains, NY (US); Tayfun Gokmen, Briarcliff Manor, NY (US); Malte Rasch, Chappaqua, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 267 days.

(21) Appl. No.: 16/439,246

(22) Filed: Jun. 12, 2019

(65) Prior Publication Data

US 2020/0394252 A1    Dec. 17, 2020

(51) Int. Cl.
| | |
|---|---|
| *G06N 3/063* | (2006.01) |
| *H03F 3/70* | (2006.01) |
| *G06F 17/16* | (2006.01) |
| *G06N 3/08* | (2006.01) |

(52) U.S. Cl.
CPC ........... *G06F 17/16* (2013.01); *G06N 3/0635* (2013.01); *G06N 3/08* (2013.01); *H03F 3/70* (2013.01)

(58) Field of Classification Search
CPC ... G06G 7/18; G06G 7/184–1865; H03F 3/70
See application file for complete search history.

(56) References Cited

U.S. PATENT DOCUMENTS

| | | |
|---|---|---|
| 6,259,644 B1 | 7/2001 | Tran et al. |
| 6,894,938 B2 | 5/2005 | Smith et al. |
| 8,305,793 B2 | 11/2012 | Majewski et al. |
| 9,715,655 B2 | 7/2017 | Wu et al. |
| 9,767,407 B2 | 9/2017 | Cho et al. |
| 9,779,355 B1 * | 10/2017 | Leobandung .......... G06N 3/084 |

(Continued)

FOREIGN PATENT DOCUMENTS

WO    WO 2014/175896 A1    10/2014

OTHER PUBLICATIONS

Gokmen et al., "Acceleration of Deep Neural Network Training with Resistive Cross-Point Devices: Design Considerations", Frontiers in Neuroscience, Jul. 2016, pp. 1-13.

(Continued)

*Primary Examiner* — Matthew D Sandifer
(74) *Attorney, Agent, or Firm* — Tutunjian & Bitetto, P.C.; Randall Bluestone

(57) ABSTRACT

An apparatus and method are provided for saturation prevention of a current integrator in a Resistive Processing Unit-based (RPU-based) accelerator. The apparatus includes a set of hardware switches. The apparatus further includes a voltage generator, operatively coupled between an input terminal and an output terminal of the current integrator, reducing a magnitude of an output voltage at the output terminal of the current integrator during a current integration operation by selectively applying a non-zero initial voltage to the current integrator prior to the current integration operation, responsive to an operating state of the set of hardware switches.

15 Claims, 11 Drawing Sheets

(56) References Cited

U.S. PATENT DOCUMENTS

| | | |
|---|---|---|
| 9,966,127 B2 | 5/2018 | Bedeschi et al. |
| 2007/0233761 A1 | 10/2007 | Mouttet |
| 2017/0109626 A1 | 4/2017 | Gokmen et al. |
| 2018/0005110 A1 | 1/2018 | Gokmen et al. |
| 2018/0122364 A1* | 5/2018 | Lim .................... G09G 3/3291 |
| 2018/0225567 A1 | 8/2018 | Bedell et al. |
| 2018/0253642 A1 | 9/2018 | Gokmen et al. |
| 2018/0293209 A1 | 10/2018 | Gokmen et al. |
| 2021/0072087 A1* | 3/2021 | Petigny ............... H03F 3/45991 |

OTHER PUBLICATIONS

Gokmen et al., Training Deep Convolutional Neural Networks with Resistive Cross-Point Devices, Frontiers in Neuroscience, Oct. 2017, pp. 1-13.

Haensch et al., "The Next Generation of Deep Learning Hardware: Analog Computing", Proceedings of the IEEE, Jan. 2019, pp. 108-122, vol. 107, No. 1.

Krestinskaya et al., "Learning in Memristive Neural Network Architectures using Analog Backpropagation Circuitsar", Xiv:1808.10631v1 [cs.ET] Aug. 31, 2018, pp. 1-14.

Solomon, Paul M., "Analog Neuromorphic Computing using Programmable Resistor Arrays", Solid-State Electronics, Mar. 2019, 33 pages.

* cited by examiner

INTEGRATOR VOLTAGE SHIFTING FOR IMPROVED PERFORMANCE IN SOFTMAX OPERATION

BACKGROUND

The present invention generally relates to machine learning, and more particularly to integrator voltage shifting for improved performance in a softmax operation.

SUMMARY

According to an aspect of the present invention, an apparatus is provided for saturation prevention of a current integrator in a Resistive Processing Unit-based (RPU-based) accelerator. The apparatus includes a set of hardware switches. The apparatus further includes a voltage generator, operatively coupled between an input terminal and an output terminal of the current integrator, reducing a magnitude of an output voltage at the output terminal of the current integrator during a current integration operation by selectively applying a non-zero initial voltage to the current integrator prior to the current integration operation, responsive to an operating state of the set of hardware switches.

According to another aspect of the present invention, a method is provided for saturation prevention of a current integrator in a Resistive Processing Unit-based (RPU-based) accelerator. The method includes reducing, by a voltage generator operatively coupled between an input terminal and an output terminal of the current integrator, a magnitude of an output voltage at the output terminal of the current integrator during a current integration operation by selectively applying a non-zero initial voltage to the current integrator prior to the current integration operation, responsive to an operating state of the set of hardware switches.

According to yet another aspect of the present invention, an apparatus is provided for saturation prevention of a current integrator in a Resistive Processing Unit-based (RPU-based) accelerator. The apparatus includes a saturation detector for detecting an impending saturation condition of an output of the current integrator. The apparatus further includes a current source trigger signal generator for generating a trigger signal responsive to a detection of the impending saturation condition. The apparatus also includes a current source for reducing a magnitude of an existing current at the input terminal of the current integrator during a current integration operation by generating a current of opposing polarity to the existing current at the input terminal to prevent an occurrence of the saturation condition, responsive to the trigger signal.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

The present invention is directed to integrator voltage shifting for improved performance in a softmax operation. A softmax operation is a mathematical operation that transforms numbers (aka logits) into a set of output probabilities that sum to one. Logits are the raw scores output by the last layer of a neural network, before activation takes place. A softmax function outputs a vector that represents the probability distributions of a list of potential outcomes. The output probabilities in the set range from zero to one.

In an embodiment, a proposed Resistive Processing Unit-based (RPU-based) device can store and update weight values locally thus minimizing data movement during training and allowing fully exploitation of the locality and parallelism of the training algorithm. In an embodiment, the present invention performs voltage (or current) shifting for improved performance in current integrating operations such as a softmax operation performed by a RPU-based device.

Figure 1:
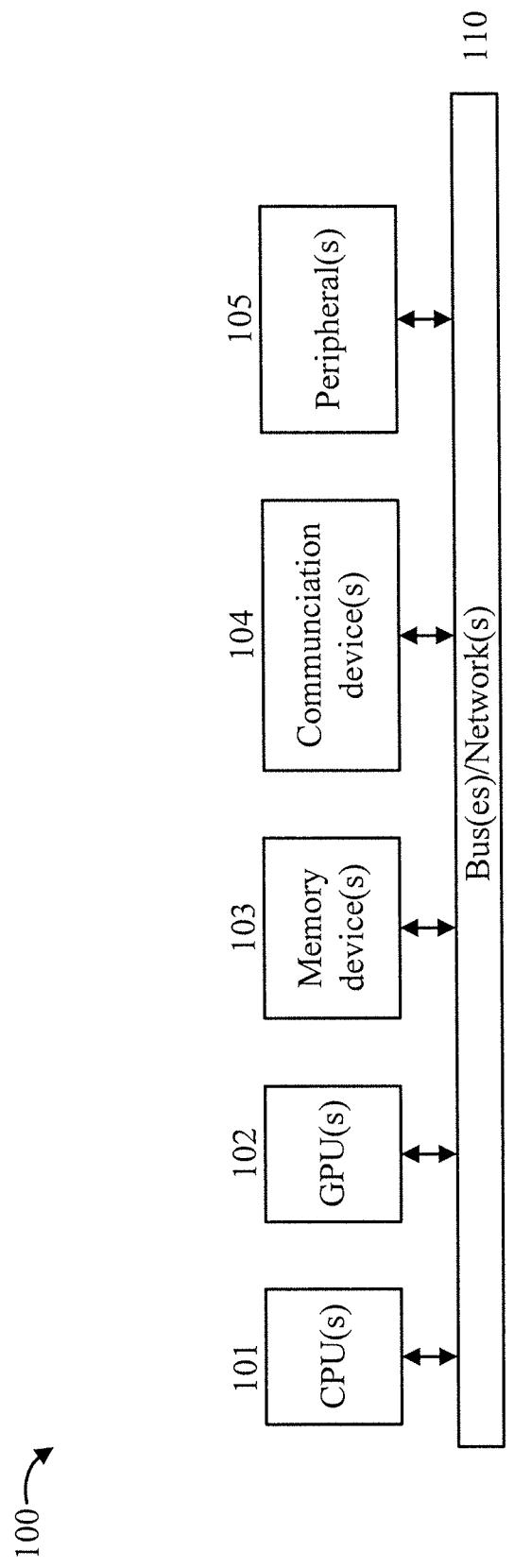
FIG. 1 is a block diagram showing an exemplary processing system to which the present invention may be applied, in accordance with an embodiment of the present invention.

FIG. 1 is a block diagram showing an exemplary processing system 100 to which the present invention may be applied, in accordance with an embodiment of the present invention. The processing system 100 includes a set of processing units (e.g., CPUs) 101, a set of GPUs 102, a set of memory devices 103, a set of communication devices 104, and set of peripherals 105. The CPUs 101 can be single or multi-core CPUs. The GPUs 102 can be single or multi-core GPUs. The one or more memory devices 103 can include caches, RAMs, ROMs, and other memories (flash, optical, magnetic, etc.). The communication devices 104 can include wireless and/or wired communication devices (e.g., network (e.g., WIFI, etc.) adapters, etc.). The peripherals 105 can include a display device, a user input device, a printer, an imaging device, and so forth. Elements of processing system 100 are connected by one or more buses or networks (collectively denoted by the figure reference numeral 110).

In an embodiment, memory devices 103 can store specially programmed software modules in order to transform the computer processing system into a special purpose computer configured to implement various aspects of the present invention. In an embodiment, special purpose hardware (e.g., Application Specific Integrated Circuits, and so forth) can be used to implement various aspects of the present invention.

Of course, the processing system 100 may also include other elements (not shown), as readily contemplated by one of skill in the art, as well as omit certain elements. For example, various other input devices and/or output devices can be included in processing system 100, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized as readily appreciated by one of ordinary skill in the art. These and other variations of the processing system 100 are readily contemplated by one of ordinary skill in the art given the teachings of the present invention provided herein.

Moreover, it is to be appreciated that various figures as described below with respect to various elements and steps relating to the present invention that may be implemented, in whole or in part, by one or more of the elements of system 100.

Figure 2:
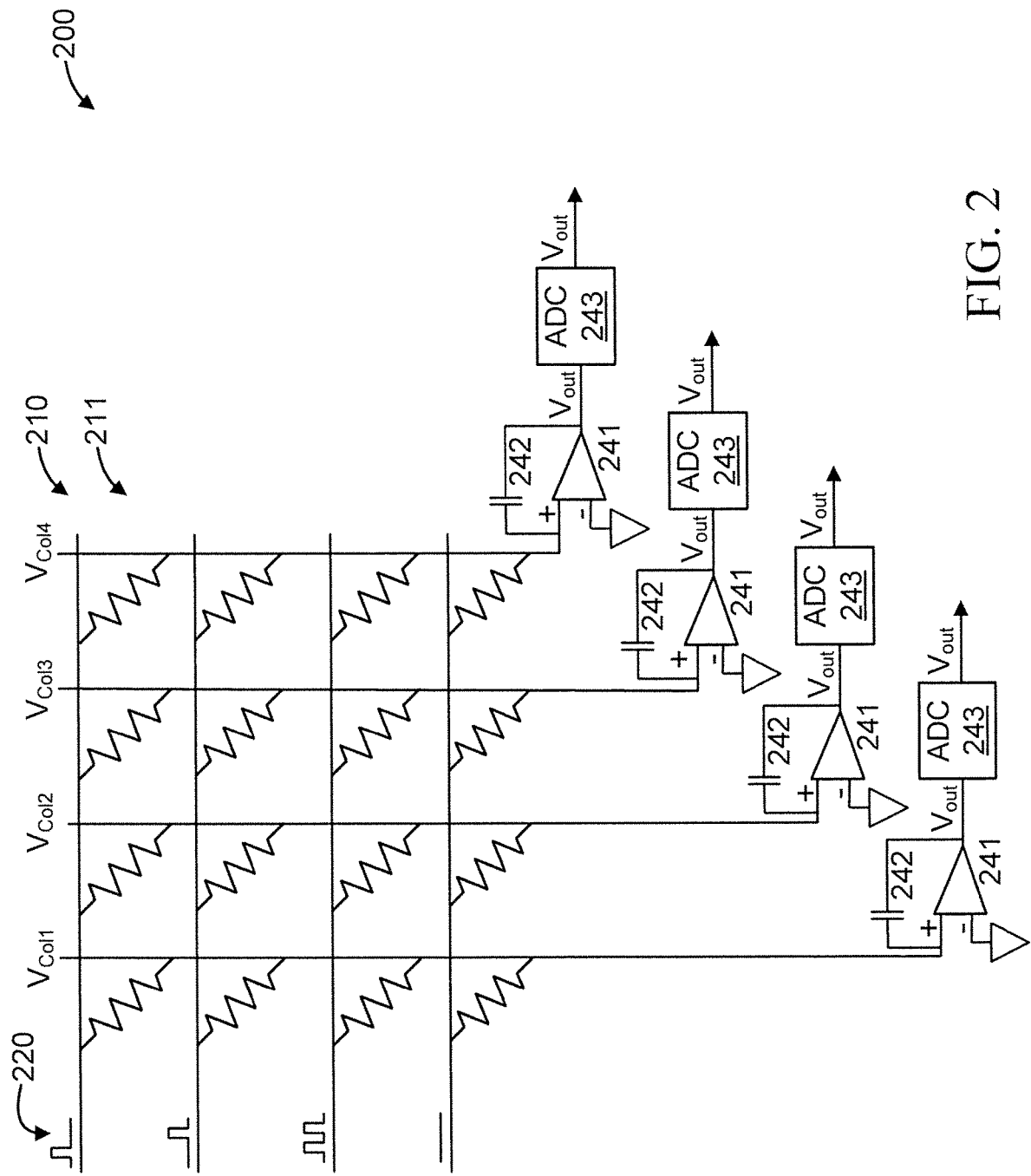
FIG. 2 is a block diagram showing an exemplary Resistive Processing Unit-based (RPU-based) neural network training accelerator to which the present invention can be applied, in accordance with an embodiment of the present invention.

FIG. 2 is a block diagram showing an exemplary Resistive Processing Unit-based (RPU-based) neural network training accelerator 200 to which the present invention can be applied, in accordance with an embodiment of the present invention. The accelerator is used to accelerate training of a neural network such as, for example, a deep neural network.

A cross-point array 210 with RPU devices 211 can be used as an analog-vector-matrix multiplier. Training of the cross-point array 210 involves forward and backward propagation. The input vector is a voltage pulse 220 in each row. A weight matrix 230 is represented by the respective conductance of the resistive devices. An output vector 240 can be obtained from the current in each column, e.g., using a respective current integrator 241 and a respective Analog-to-Digital Converter (ADC) 243 coupled to each of the four columns of the cross-point array. In particular, the ADC is connected to an output of the current integrator 241 in order to output a digital value from an integrated analog input. A respective capacitor 242 is connected across one (the non-inverting) of the input terminals and an output terminal of each current integrator 241. The other (inverting) input terminal of the current integrator 241 is connected to ground.

Using the cross-point array 210, large vector-matrix multiplication can be computed in a single time step (O(1)). The RPU-based accelerator 200 has a significantly improved power efficiency compared to a CPU or GPU.

Figure 3:
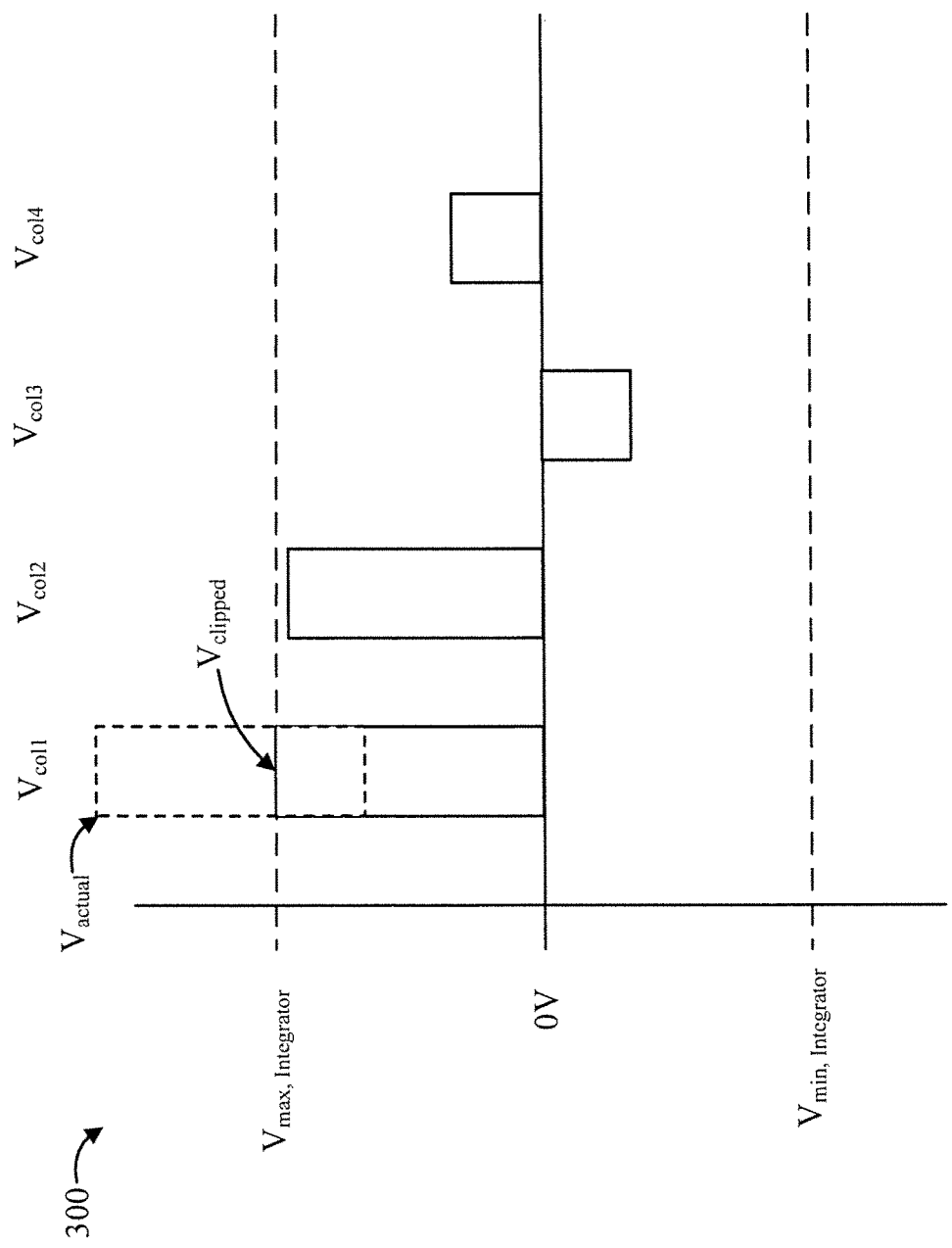
FIG. 3 is a plot showing current integrator voltages to which the present invention can be applied, in accordance with an embodiment of the present invention.

The current integrator 241 is used to perform matrix multiplication using pulse-width modulated reading signals. However, depending on the input voltage and weight values, the voltage readings at the current integrator 241 can be saturated. In such a case, the voltage of the current integrator does not correctly represent the calculation results and can cause significant problems in certain cases such as, for example, but not limited to, a softmax operation. FIG. 3 is a plot showing current integrator voltages 300 to which the present invention can be applied, in accordance with an embodiment of the present invention. The plot shows voltages relating to the columns of the cross-point array 210. For example, the plot shows $V_{min, Integrator}$, $V_{max, Integrator}$, $V_{actual}$, and $V_{clipped}$. As shown, the actual voltage $V_{actual}$ is clipped ($V_{clipped}$).

Instead of starting from the center voltage when performing integration, the capacitor voltage at Vmin (or Vmax, depending upon the application) is initialized. This enables increasing the integrator voltage range by 2× towards a preferred direction. Accordingly, the information required for maximum value detection, such as in a softmax or other neural network operation, is not lost.

Figure 4:
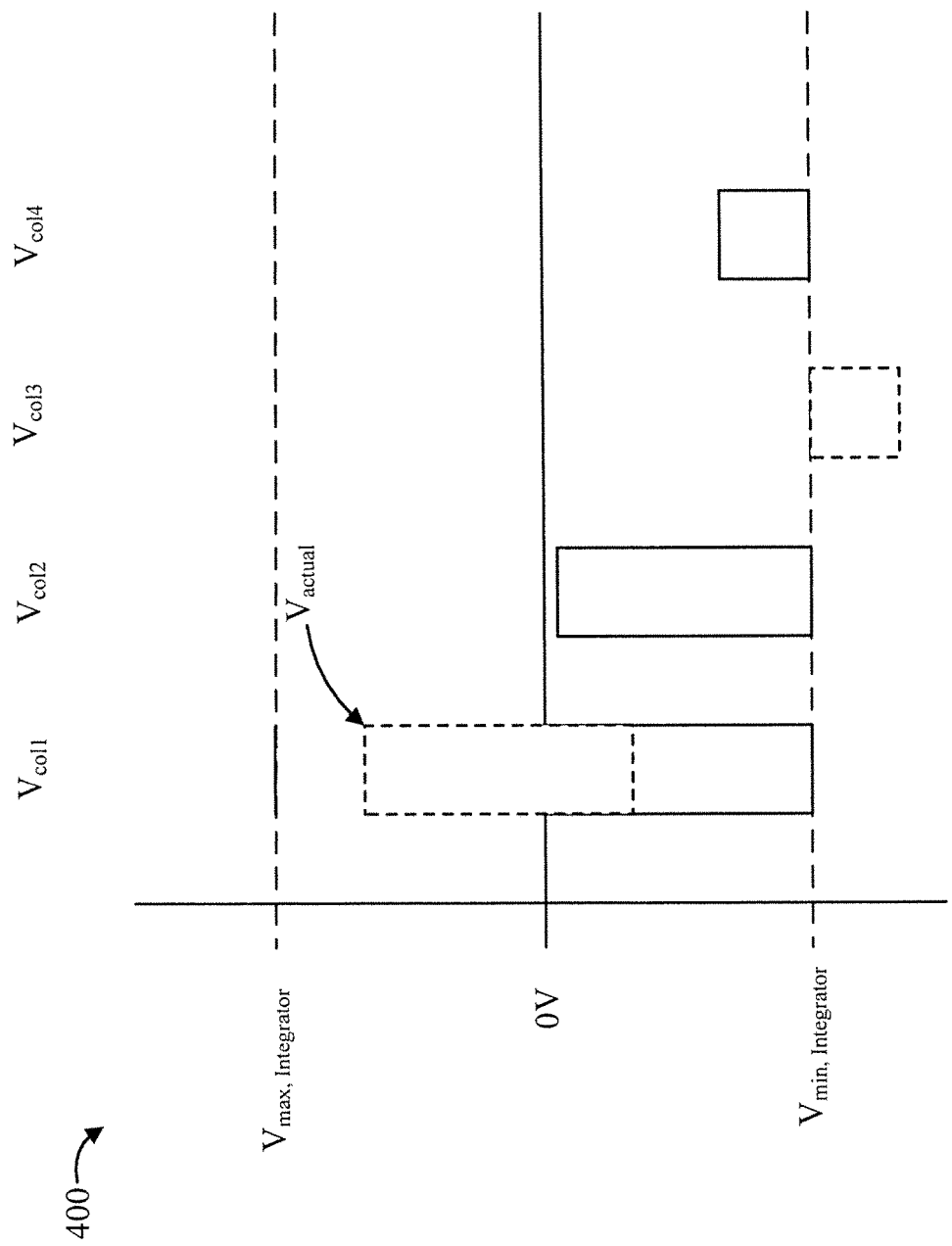
FIG. 4 is a plot showing correct calculation results for the current integrator voltage, in accordance with an embodiment of the present invention

FIG. 4 is a plot showing correct calculation results 400 for the current integrator voltage, in accordance with an embodiment of the present invention.

As shown, the voltage of the current integrator never exceeds $V_{min, Integrator}$ or $V_{max, Integrator}$.

It is to be appreciated that a current integrator is conventionally initialized to zero volts (0V) before performing integration, by grounding a capacitor that is connected between an input terminal and an output terminal of the current integrator. In contrast, the present invention initializes the current integrator voltage to a non-zero (i.e., negative) voltage. In this way, clipping of the output signal of the current integrated is avoided.

Figure 5:
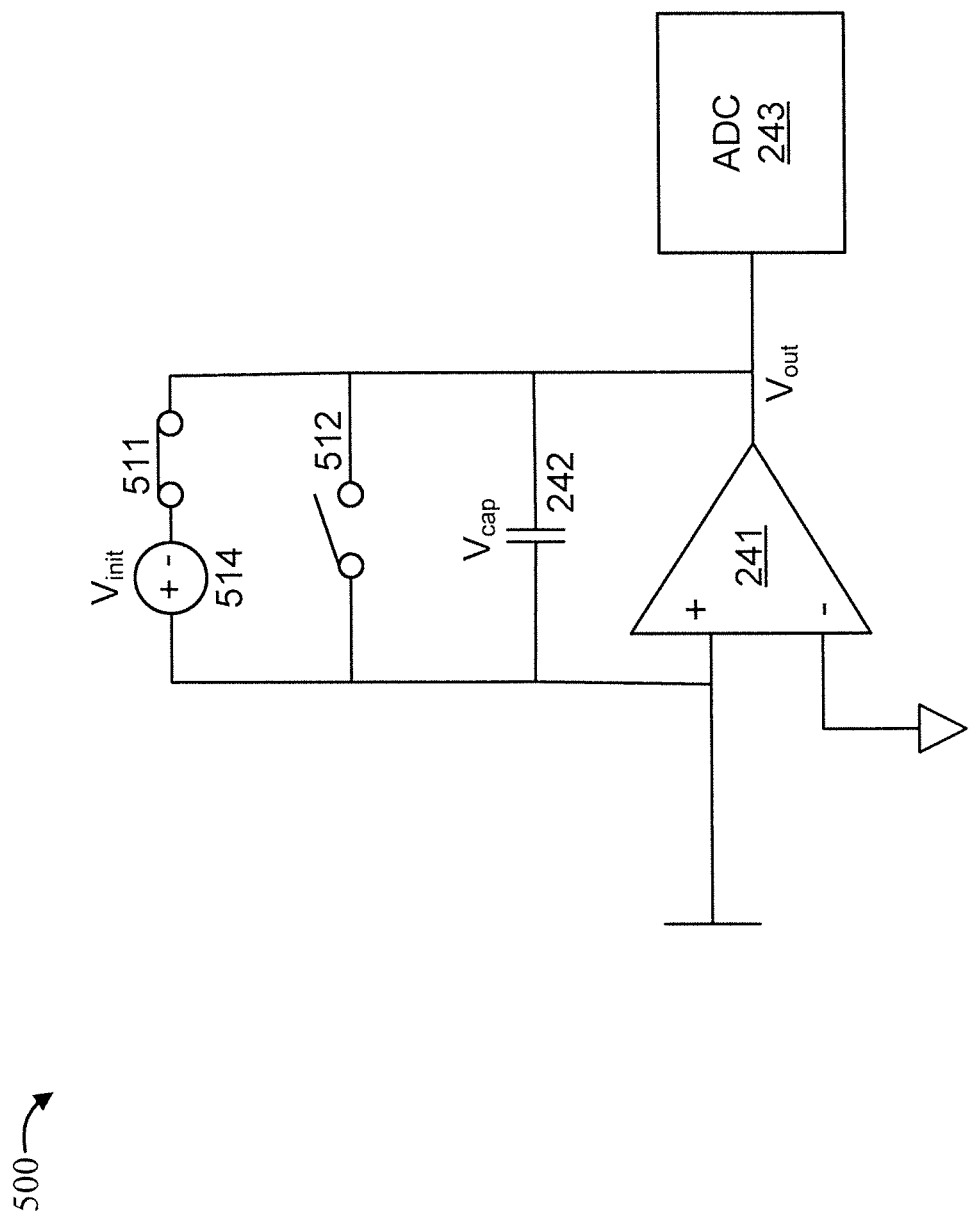
FIG. 5 is a diagram showing an exemplary initialization of a current integrator voltage to a non-zero voltage, in accordance with an embodiment of the present invention.

FIG. 5 is a diagram showing an exemplary initialization 500 of a current integrator voltage 510 to a non-zero voltage, in accordance with an embodiment of the present invention.

Instead of the typical approach of initializing $V_{cap}$ to 0V as done conventionally, in initialization 600 corresponding to the present invention, $V_{cap}$ is initialized with a non-zero (negative) value $V_{init}$ by using the switches 511 and 512. In particular, switch 511 is closed, and switch 512 is open in order to initialize $V_{cap}$ to a non-zero voltage $V_{init}$.

Figure 6:
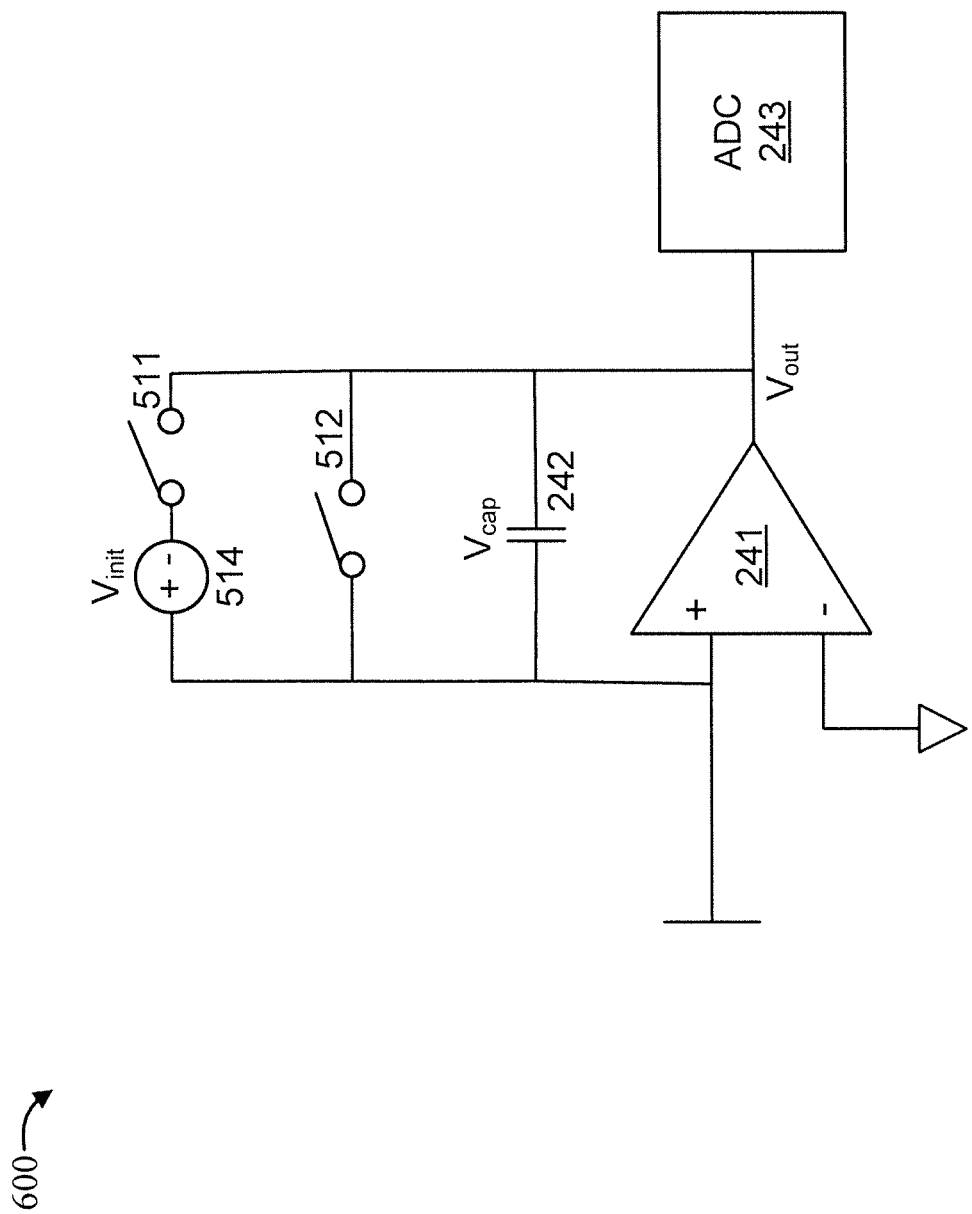
FIG. 6 is diagram showing an exemplary normal operation of the current integrator of FIG. 5, in accordance with an embodiment of the present invention.

FIG. 6 is diagram showing an exemplary normal operation 600 of the current integrator 510 of FIG. 5, in accordance with an embodiment of the present invention.

The normal operation 600 of the current integrator involves performing normal integration after opening both switches 511 and 512, with $V_{cap}=V_{init}$ (!=0V) and having 2 times the voltage range than available using the conventional initialization approach. Vinit is provided by voltage source 514.

Figure 7:
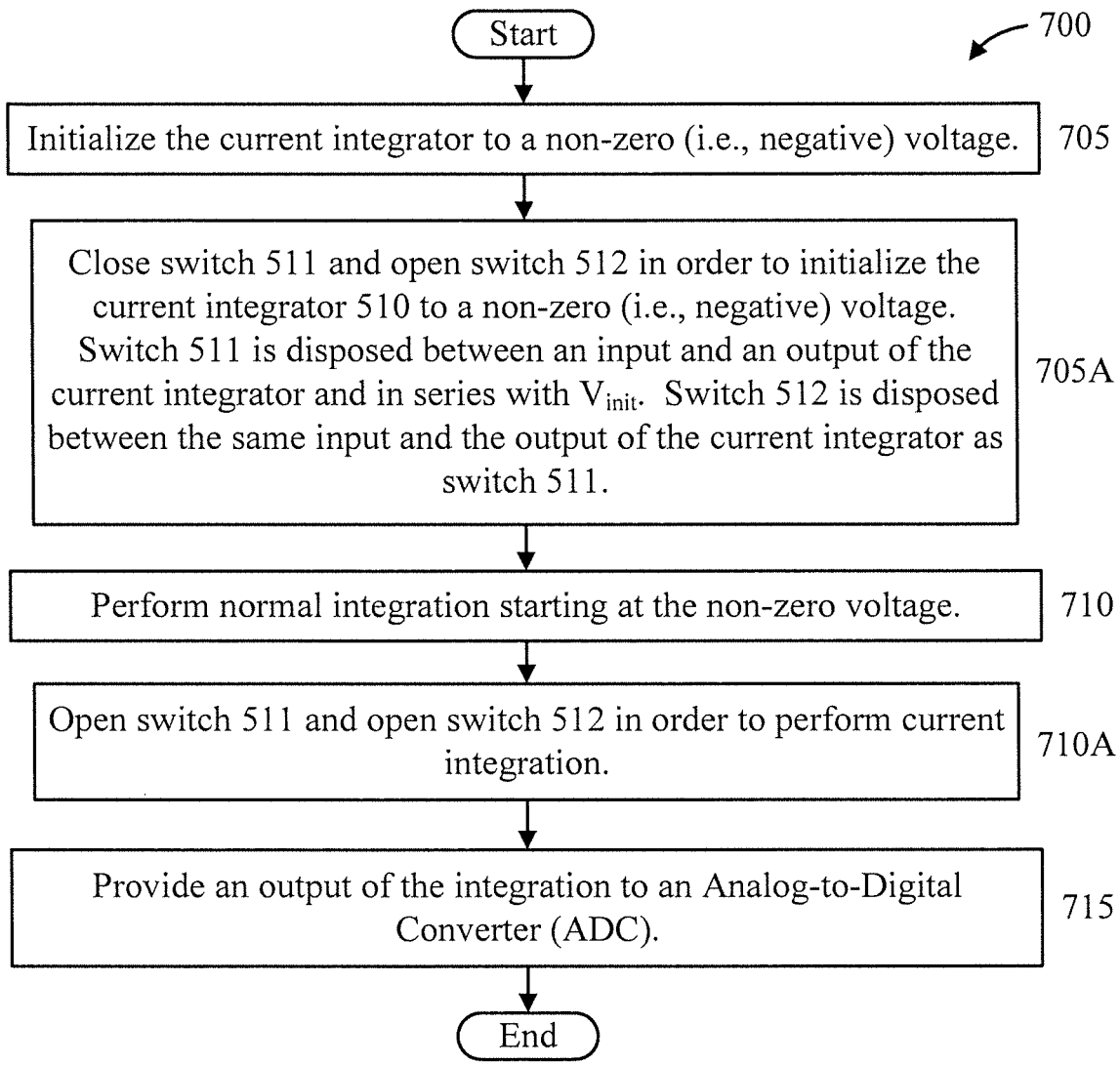
FIG. 7 is a flow diagram showing an exemplary method for performing current integration using a current integrator, in accordance with an embodiment of the present invention.

FIG. 7 is a flow diagram showing an exemplary method 700 for performing current integration using a current integrator, in accordance with an embodiment of the present invention.

At block 705, initialize the current integrator to a non-zero (i.e., negative) voltage.

In an embodiment, block 705 can include block 705A.

At block 705A, close switch 511 and open switch 512 in order to initialize the current integrator 510 to a non-zero (i.e., negative) voltage. Switch 511 is disposed between an input and an output of the current integrator and in series with Villa. Switch 512 is disposed between the same input and the output of the current integrator as switch 511.

At block 710, perform normal integration starting at the non-zero voltage.

In an embodiment, block 710 can include block 710A.

At block 710A, open switch 511 and open switch 512 in order to perform current integration.

At block 715, provide an output of the integration to an Analog-to-Digital Converter (ADC).

Figure 8:
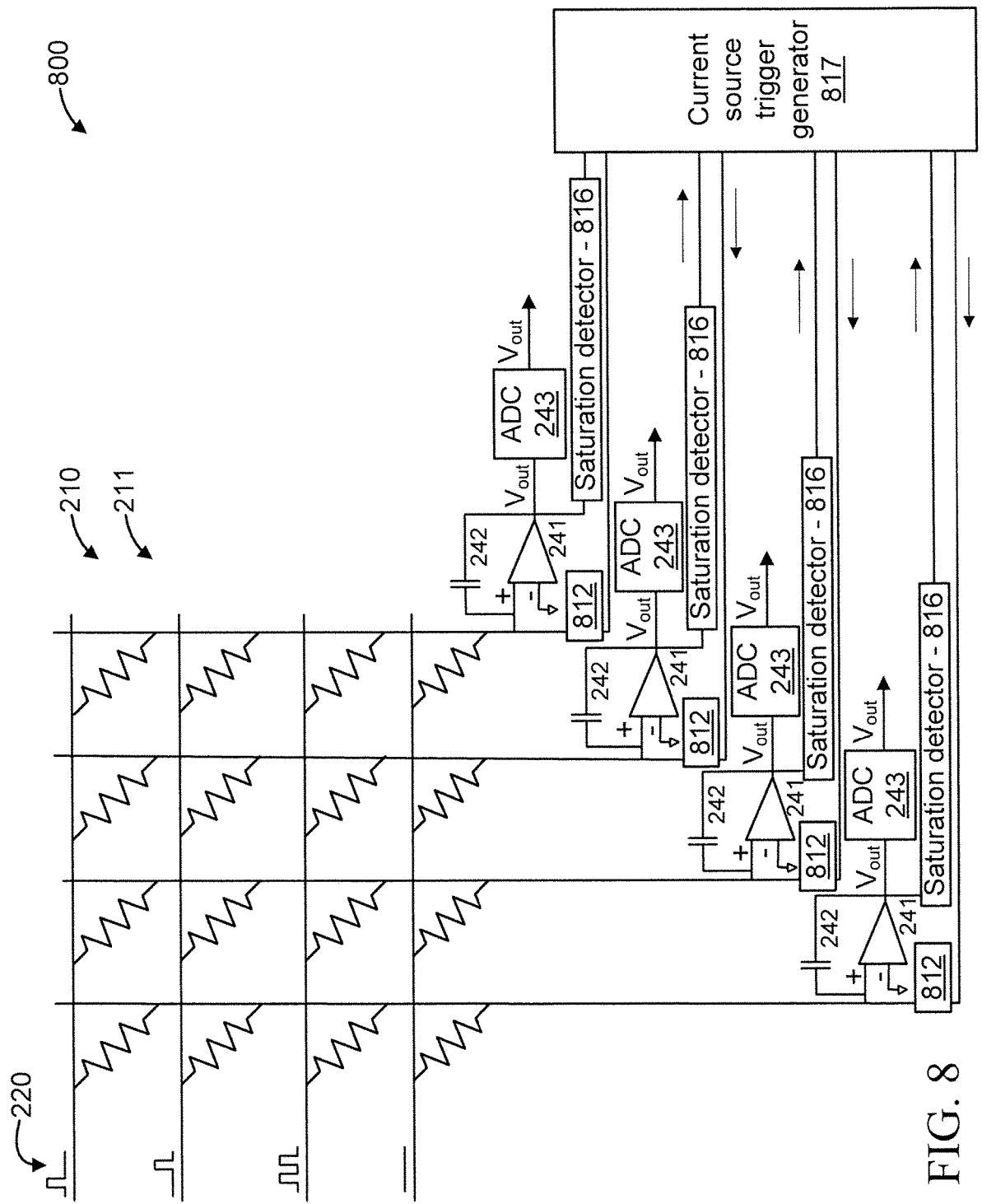
FIG. 8 is a diagram showing an exemplary Resistive Processing Unit-based (RPU-based) neural network training accelerator to which the present invention can be applied, in accordance with an embodiment of the present invention.

FIG. 8 is a diagram showing an exemplary Resistive Processing Unit-based (RPU-based) neural network training accelerator 800 to which the present invention can be applied, in accordance with an embodiment of the present invention.

A cross-point array 810 with RPU devices 811 has a current source 812, a current integrator 813, and an ADC 814 at the bottom of the columns of the array 810. A respective capacitor 815 is connected across one of the input terminals and an output terminal of the current integrator 813. The other input of each of the current integrators 813 is connected to ground.

A respective saturation detector 816 is connected to the output terminal of the current integrator 813 and to a current source trigger signal generator 817. Each of the current sources 812 is controlled by the current source trigger signal generator 817, based on the saturation status as detected by the saturation detector 816.

When the current source trigger signal generator 816 outputs a trigger signal to one or more of the current sources, the current sources will start flowing negative current to discharge the capacitor 815. Then, $V_{cap}$ at each integrator will start to decrease and allow a $V_{cap}$ margin to prevent clipping.

Thus, instead of starting from the center voltage when performing integration, the present invention can initialize a capacitor voltage at Vmin (or Vmax, depending upon the application). This enable an increase in the current integrator output voltage range by 2× towards the preferred direction. Hence, information required for maximum value detection (e.g., in the case of softmax) is not lost.

Figure 9:
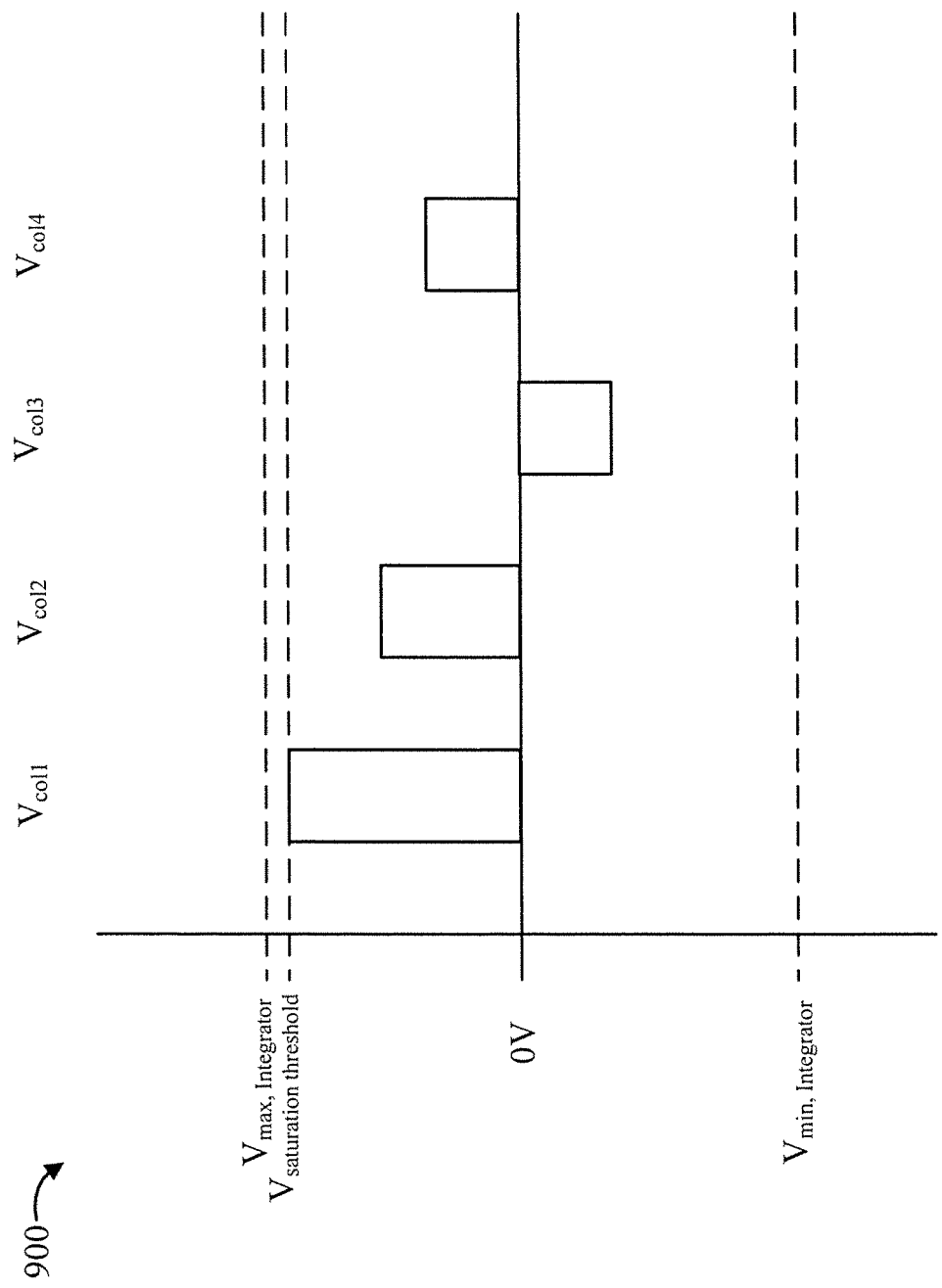
FIG. 9 is a plot showing current integrator voltage to which the present invention can be applied, in accordance with an embodiment of the present invention.

FIG. 9 is a plot showing current integrator voltage 900 to which the present invention can be applied, in accordance with an embodiment of the present invention.

The plot shows $V_{min,\ Integrator}$, $V_{max,\ Integrator}$ and $V_{saturation\ threshold}$. As is evident, $V_{saturation}$ threshold is right below $V_{max,\ Integrator}$. This situation is specifically addressed and corrected by the present invention as shown in FIG. 9.

Figure 10:
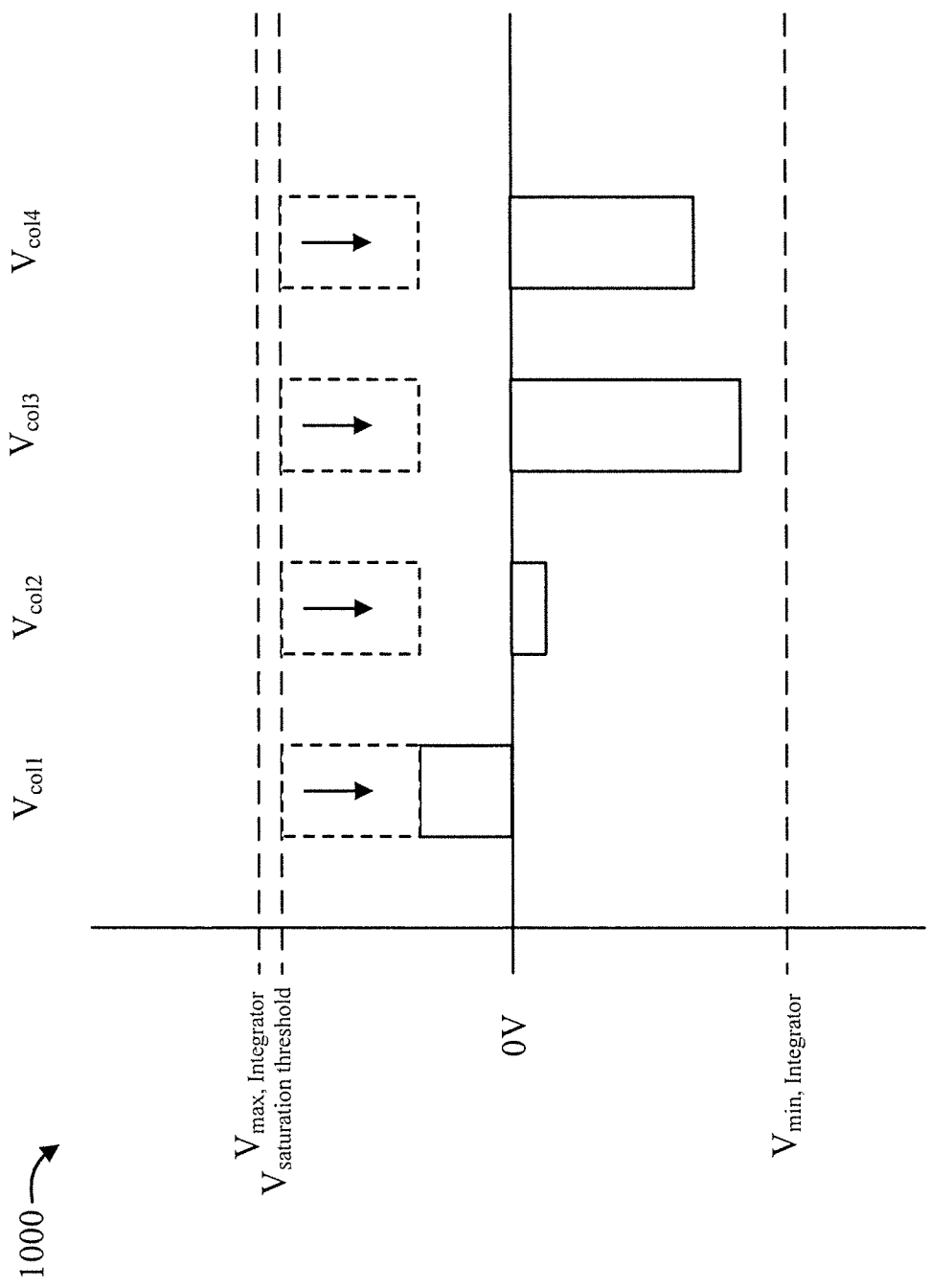
FIG. 10 is a plot showing a modified voltage of the current integrator voltage of FIG. 9, in accordance with an embodiment of the present invention.

FIG. 10 is a plot showing a modified voltage 1000 of the current integrator voltage 900 of FIG. 9, in accordance with an embodiment of the present invention.

The modified voltage 1000 has a range dynamically obtained by the present invention. That is, $V_{col1}$, $V_{col2}$, $V_{col3}$, and $V_{col4}$ has been shifted down to avoid output saturation.

Figure 11:
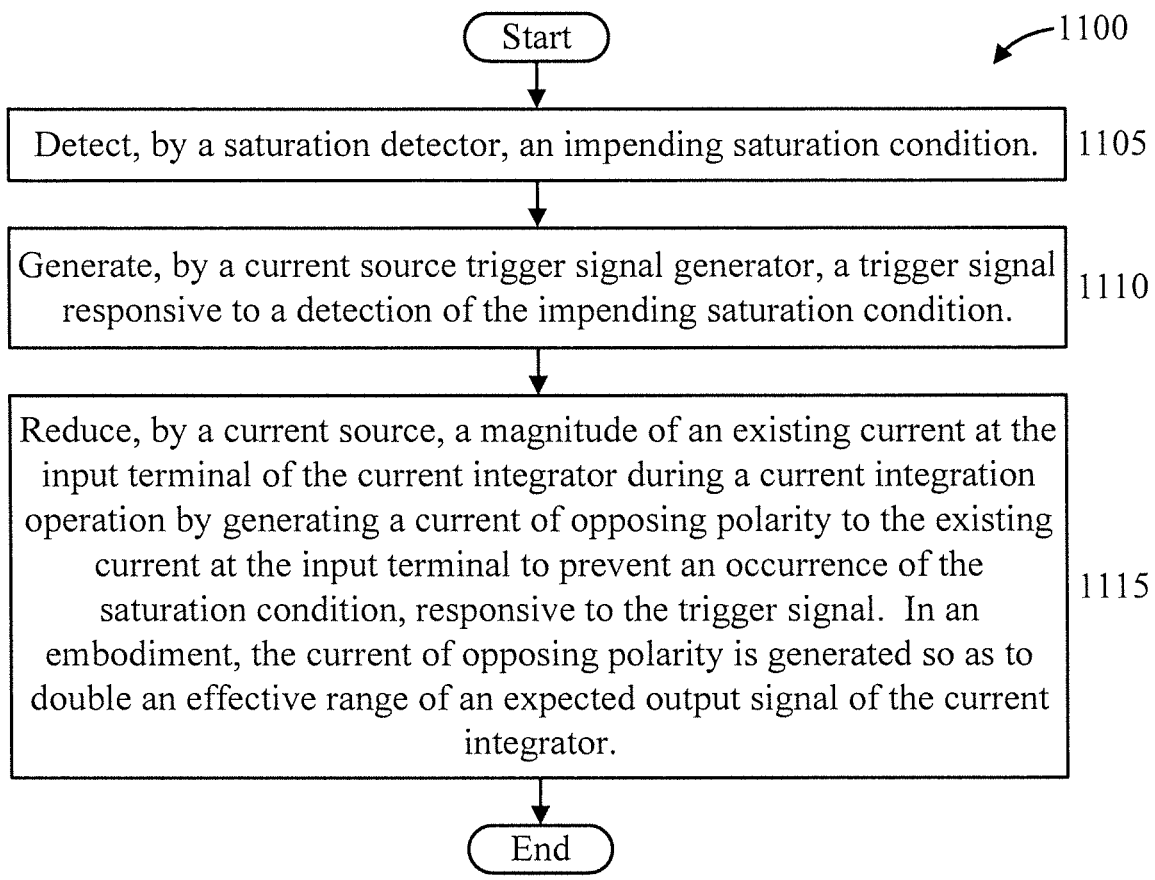
FIG. 11 is a flow diagram showing an exemplary method for detecting an impending saturation condition of an output of the current integrator, in accordance with an embodiment of the present invention.

FIG. 11 is a flow diagram showing an exemplary method for detecting an impending saturation condition of an output of the current integrator, in accordance with an embodiment of the present invention.

At block 1105, detect, by a saturation detector, an impending saturation condition.

At block 1110, generate, by a current source trigger signal generator, a trigger signal responsive to a detection of the impending saturation condition.

At block 1115, reduce, by a current source, a magnitude of an existing current at the input terminal of the current integrator during a current integration operation by generating a current of opposing polarity to the existing current at the input terminal to prevent an occurrence of the saturation condition, responsive to the trigger signal. In an embodiment, the current of opposing polarity can be generated so as to double an effective range of an expected output signal of the current integrator.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as SMALLTALK, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. An apparatus for saturation prevention of a current integrator in a Resistive Processing Unit-based (RPU-based) accelerator, comprising:
    a set of hardware switches; and
    a voltage generator, operatively coupled between an input terminal and an output terminal of the current integrator, reducing a magnitude of an output voltage at the output terminal of the current integrator during a current integration operation by selectively applying a non-zero initial voltage to the current integrator prior to the current integration operation, responsive to an operating state of the set of hardware switches,
    wherein the current integration operation is part of a softmax operation.

2. The apparatus of claim 1, wherein the set of hardware switches comprises a first switch and a second switch, each operatively coupled in parallel between the input terminal and the output terminal of the current integrator, the first switch being in series with the voltage generator.

3. The apparatus of claim 2, wherein the first switch is closed and the second switch is open to selectively apply the non-zero initial voltage to the current integrator prior to the current integration, and wherein the first switch and the second switch are open during the current integration.

4. The apparatus of claim 2, wherein another input terminal of the current integrator is grounded.

5. The apparatus of claim 2, further comprising a capacitor connected between the input terminal and the output terminal, in parallel with the first switch, the voltage generator, and the second switch.

6. The apparatus of claim 1, wherein the non-zero initial voltage is generated to have a polarity opposing an expected polarity of the output voltage at the output terminal of the current integrator to reduce the magnitude of the output voltage at the output terminal of the current integrator below a saturating value.

7. The apparatus of claim 1, wherein the non-zero initial voltage is selected to double an effective range of the output signal at the output terminal of the current integrator.

8. The apparatus of claim 1, wherein the input terminal of the current integrator is connected to a column of RPU devices of the RPU-based accelerator.

9. The apparatus of claim 1, wherein the voltage generator selectively pulls the output voltage at the output terminal of the current integrator up or down by an amount corresponding to the initial non-zero voltage to avoid a saturation state, responsive to the operating state of the set of hardware switches.

10. A method for saturation prevention of a current integrator in a Resistive Processing Unit-based (RPU-based) accelerator, comprising:
reducing, by a voltage generator operatively coupled between an input terminal and an output terminal of the current integrator, a magnitude of an output voltage at the output terminal of the current integrator during a current integration operation by selectively applying a non-zero initial voltage to the current integrator prior to the current integration operation, responsive to an operating state of the set of hardware switches,
wherein the current integration operation is part of a softmax operation.

11. The method of claim 10, wherein the set of hardware switches comprises a first switch and a second switch, the first switch and the second switch both being operatively coupled in parallel between the input terminal and the output terminal of the current integrator, the first switch being in series with the voltage generator, and the method further comprises:

closing the first switch and opening the second switch to selectively apply the non-zero initial voltage to the current integrator prior to the current integration; and opening the first switch and the second switch during the current integration.

12. The method of claim 11, further comprising connecting a capacitor between the input terminal and the output terminal, in parallel with the first switch, the voltage generator, and the second switch.

13. The method of claim 10, wherein the non-zero initial voltage is generated to have a polarity opposing an expected polarity of the output voltage at the output terminal of the current integrator to reduce the magnitude of the output voltage at the output terminal of the current integrator below a saturating value.

14. The method of claim 10, further comprising selecting the non-zero initial voltage so as to double an effective range of the output signal at the output terminal of the current integrator.

15. The method of claim 10, wherein the voltage generator selectively pulls the output voltage at the output terminal of the current integrator up or down by an amount corresponding to the initial non-zero voltage to avoid a saturation state, responsive to the operating state of the set of hardware switches.

* * * * *